(12) United States Patent
Elsherbini et al.

(10) Patent No.: US 10,594,294 B2
(45) Date of Patent: Mar. 17, 2020

(54) PIEZOELECTRIC PACKAGE-INTEGRATED DELAY LINES

(71) Applicant: Intel Corporation, Santa Clara, CA (US)

(72) Inventors: Adel A. Elsherbini, Chandler, AZ (US); Feras Eid, Chandler, AZ (US); Baris Bicen, Chandler, AZ (US); Telesphor Kamgaing, Chandler, AZ (US); Vijay K. Nair, Mesa, AZ (US); Georgios C. Dogiamis, Gilbert, AZ (US); Johanna M. Swan, Scottsdale, AZ (US); Valluri R. Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 758 days.

(21) Appl. No.: 15/088,830

(22) Filed: Apr. 1, 2016

(65) Prior Publication Data

US 2017/0288639 A1 Oct. 5, 2017

(51) Int. Cl.
*H03H 9/13* (2006.01)
*H03H 9/36* (2006.01)

(52) U.S. Cl.
CPC .............. *H03H 9/133* (2013.01); *H03H 9/36* (2013.01)

(58) Field of Classification Search
CPC .................................. H03H 9/133; H03H 9/36
USPC .......................... 333/133, 187, 188, 193–196
See application file for complete search history.

(56) References Cited

U.S. PATENT DOCUMENTS

| | | | |
|---|---|---|---|
| 3,012,211 A | 12/1961 | Mason | |
| 5,212,988 A | 5/1993 | White et al. | |
| 9,450,563 B2 * | 9/2016 | Gorisse | H03H 9/02086 |
| 2003/0227357 A1 | 12/2003 | Metzger et al. | |
| 2005/0240110 A1 | 10/2005 | Liu et al. | |
| 2006/0022768 A1 | 2/2006 | Yokota et al. | |
| 2006/0113874 A1 | 6/2006 | Shen | |
| 2009/0295505 A1 * | 12/2009 | Mohammadi | H01L 41/107 333/191 |
| 2010/0231330 A1 * | 9/2010 | Ruile | H03H 9/0222 333/193 |
| 2011/0006638 A1 | 1/2011 | Ostrovskii et al. | |
| 2011/0140808 A1 * | 6/2011 | Kurahashi | H03H 9/0222 333/193 |

(Continued)

OTHER PUBLICATIONS

International Preliminary Report on Patentability for International Patent Application No. PCT/US2017/014720, dated Oct. 11, 2018, 12 pages.

(Continued)

*Primary Examiner* — Rakesh B Patel
*Assistant Examiner* — Jorge L Salazar, Jr.
(74) *Attorney, Agent, or Firm* — Schwabe, Williamson & Wyatt P.C.

(57) ABSTRACT

Embodiments of the invention include a waveguide structure that includes a first piezoelectric transducer that is positioned in proximity to a first end of a cavity of an organic substrate. The first piezoelectric transducer receives an input electrical signal and generates an acoustic wave to be transmitted with a transmission medium. A second piezoelectric transducer is positioned in proximity to a second end of the cavity. The second piezoelectric transducer receives the acoustic wave from the transmission medium and generates an output electrical signal.

22 Claims, 8 Drawing Sheets

(56) References Cited

U.S. PATENT DOCUMENTS

2011/0187227 A1    8/2011   Chen et al.
2016/0036580 A1    2/2016   Shealy

OTHER PUBLICATIONS

International Search Report and Written Opinion for International Patent Application No. PCT/US2017/014720, dated Apr. 24, 2017, 9 pages.
Extended European Search Report for European Patent Application No. 17776049.3 dated Oct. 28, 2019, 12 pgs.
"Suitability of Liquid Crystal Polymer Substrates for High Frequency Acoustic devices", Procedia Chemistry, vol. 1, No. 1, Sep. 2009, pp. 72-75, XP026799485.

* cited by examiner

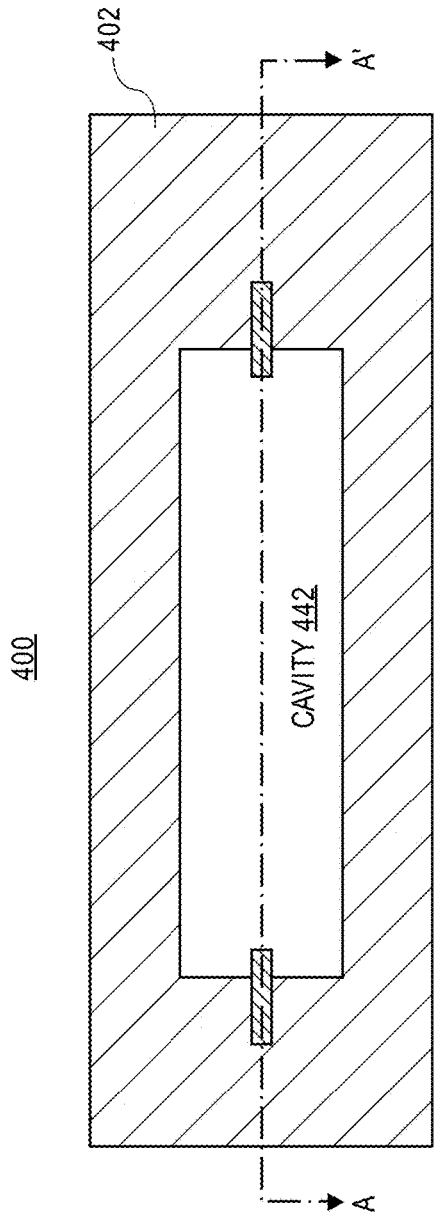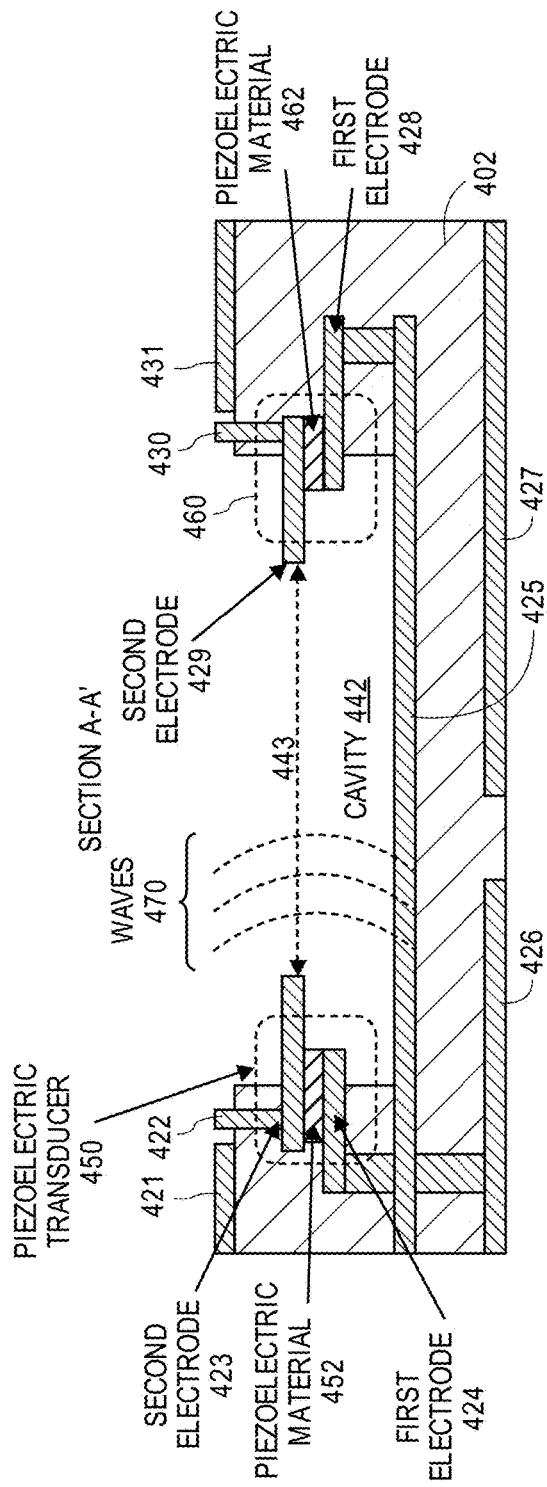

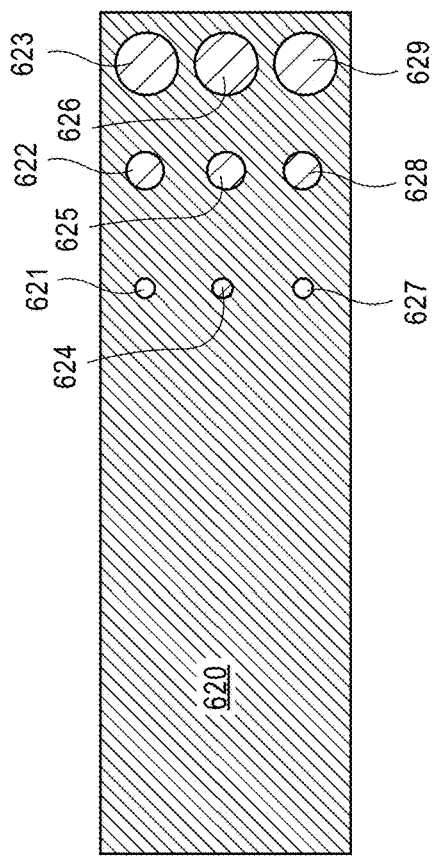
FIG. 6C
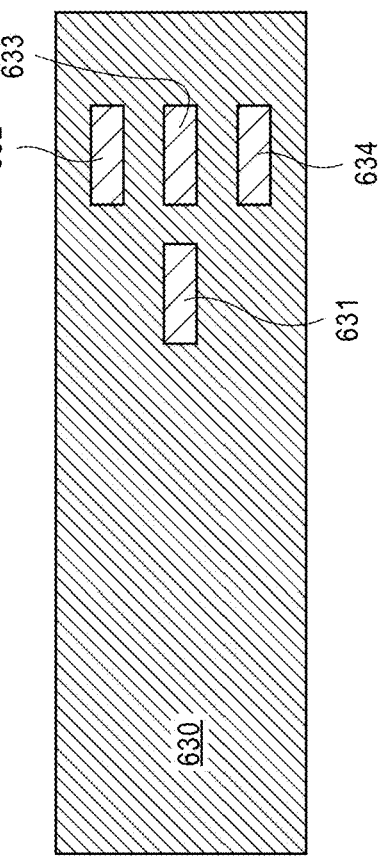
FIG. 6D
FIG. 6A
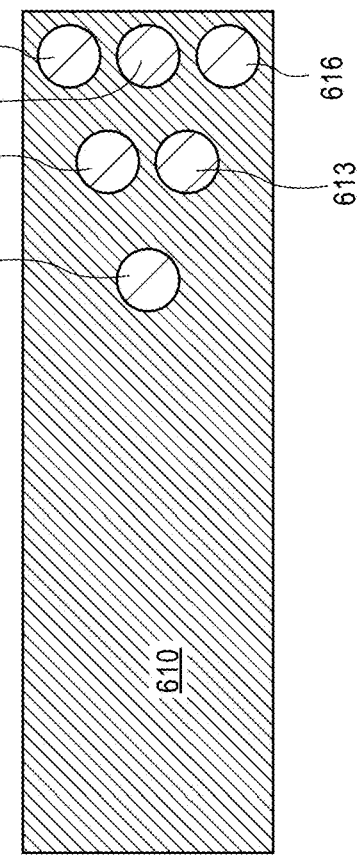
FIG. 6B

PIEZOELECTRIC PACKAGE-INTEGRATED DELAY LINES

FIELD OF THE INVENTION

Embodiments of the present invention relate generally to semiconductor package integrated devices. In particular, embodiments of the present invention relate to piezoelectric semiconductor package integrated delay lines.

BACKGROUND OF THE INVENTION

Analog delay lines are useful in many applications. For example, delay lines can be used in pulse shaping circuits which are typically used as an equalization method to account for losses and dispersion in transmission lines thus enabling higher data rates on the same lines. Delay lines can be used to simplify the circuits in many high speed digital signal processing applications such as radars and optical imaging (e.g., for removing stationary signals and monitoring only the changes in the image). Delay lines can also be used as a form of analog memory where the output is connected to the input through a transmission medium.

Typical delay lines are implemented using discrete components or electrical transmission lines. However, this results in a relatively large circuit if the delays required are long. Similarly, pulse shaping circuits which are required to significantly increase the duration of the pulse (e.g., to counteract dispersion in long transmission lines) would require relatively large circuits.

BRIEF DESCRIPTION OF THE DRAWINGS

FIG. 4A illustrates a top view of a waveguide structure having a delay line implemented with an air medium for wave transmission in accordance with one embodiment.

FIG. 4B illustrates a cross-sectional view AA' of a waveguide structure having a delay line implemented with an air medium for wave transmission in accordance with one embodiment.

FIG. 6A illustrates a transmission line have a first arrangement of perforations in accordance with one embodiment.

FIG. 6B illustrates a transmission line have a second arrangement of perforations in accordance with one embodiment.

FIG. 6C illustrates a transmission line have a third arrangement of perforations in accordance with one embodiment.

FIG. 6D illustrates a transmission line have a fourth arrangement of perforations in accordance with one embodiment.

DETAILED DESCRIPTION OF THE INVENTION

Figure 1A:
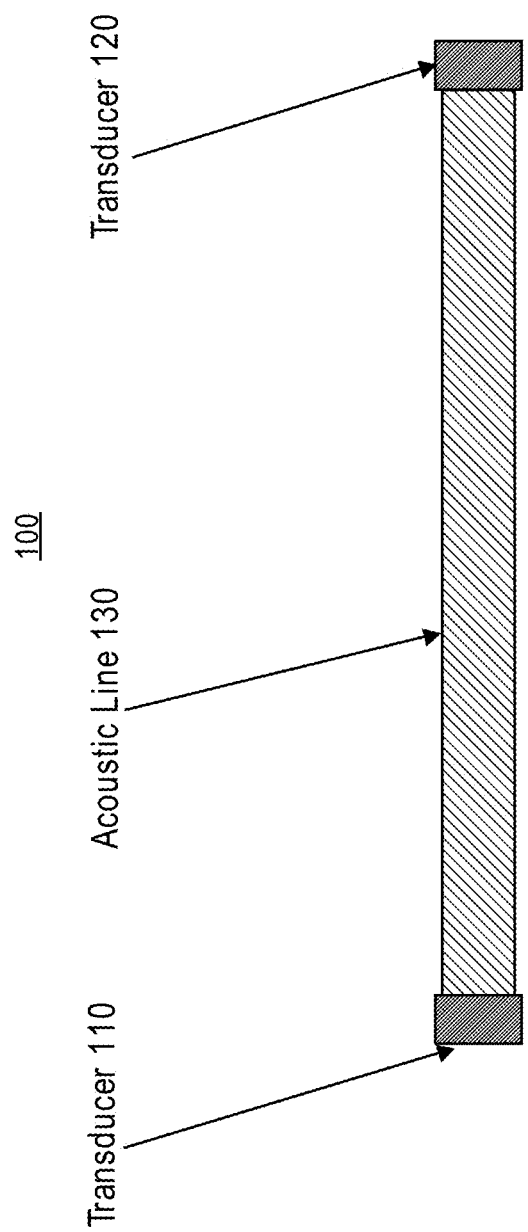
FIG. 1a illustrates a basic configuration of a beam acoustic transmission line structure in accordance with one embodiment.

Described herein are semiconductor package integrated piezoelectric delay lines. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order to not obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

The fundamental reason for large delay circuitry of prior approaches is that electromagnetic propagation speed in a transmission lines is close to or equal to the speed of light in the transmission line medium and the delay that can be achieved is proportional to the transmission line length divided by the speed of light in the medium. This requires relatively long transmission lines for longer delays due to the very fast speed of light.

The present design addresses the fabrication of delay line circuitry within the semiconductor package substrate that is compatible with high volume package substrate fabrication technology. This present design for delay line circuitry integrated in a package substrate is based on our ability to deposit piezoelectric materials in the package substrate and create cavities near the piezoelectric transducers in the substrate.

In one embodiment, this technology allows using electric to acoustic transducers in the package substrate which is coupled to the PCB to convert the electric signals into acoustic waves which are then transmitted through an acoustic transmission line or an acoustic network. Acoustic waves travel at much slower velocities than electromagnetic waves thus allowing significant size and area reduction to achieve relatively long delays or reshaped pulse widths. The present design results in package-integrated delay lines, thus enabling smaller and thinner systems in comparison to discrete components attached to a substrate or board or electrical transmission lines. The package-integrated delay lines do not add a Z height (along the vertical axis) to a total height of a substrate or multiple substrates. This present design can be manufactured as part of the substrate fabrication process with no need for purchasing and assembling discrete components. It therefore enables high volume manufacturability (and thus lower costs) of systems that need delay lines.

In one example, the present design includes package-integrated structures to act as acoustic delay lines. Those structures are manufactured as part of the package layers and can include cavities by removing the dielectric material around them. The structures include transducers having piezoelectric stacks that are deposited and patterned layer-by-layer into the package. The present design includes creating functional transducers in the package. Etching of the dielectric material in the package occurs to create cavities. Piezoelectric material deposition (e.g., 0.5 to 1 um deposition thickness) and crystallization also occurs in the package substrate during the package fabrication process. An annealing operation at a lower substrate temperature range (e.g., up to 260° C.) allows crystallization of the piezoelectric material (e.g., lead zirconate titanate (PZT), potassium sodium niobate (KNN), aluminum nitride (AlN), zinc oxide (ZnO), etc) to occur during the package fabrication process. In one example, laser pulsed annealing occurs locally with respect to the piezoelectric material for the annealing operation without damaging other layers of the package substrate (e.g., organic substrate).

Referring now to FIG. 1a, a basic configuration of a beam acoustic transmission line structure is illustrated in accordance with one embodiment. The structure includes transducers 110 and 120 and an acoustic line 130 having a beam structure (e.g., copper transmission line). In one example, the transducer 110 receives an input electrical signal and converts this signal into an acoustic transmission signal which propagates through the acoustic line 130 towards the transducer 120.

Figure 1B:
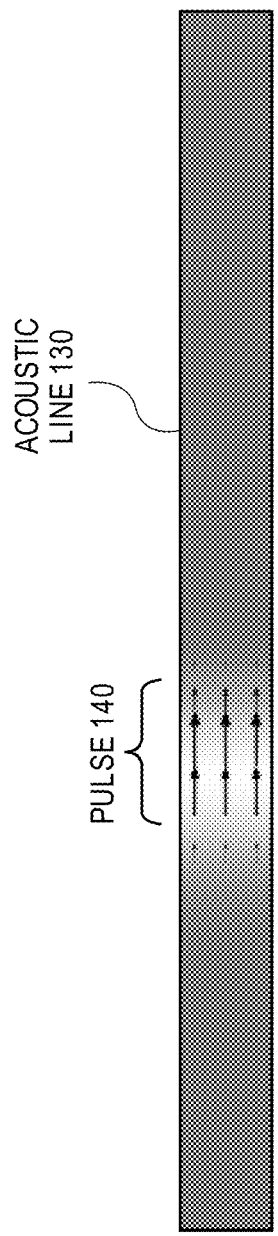
FIG. 1b illustrates a pulse 140 (e.g., acoustic transmission signal) propagating through the acoustic line 130 in accordance with one embodiment.
Figure 1C:
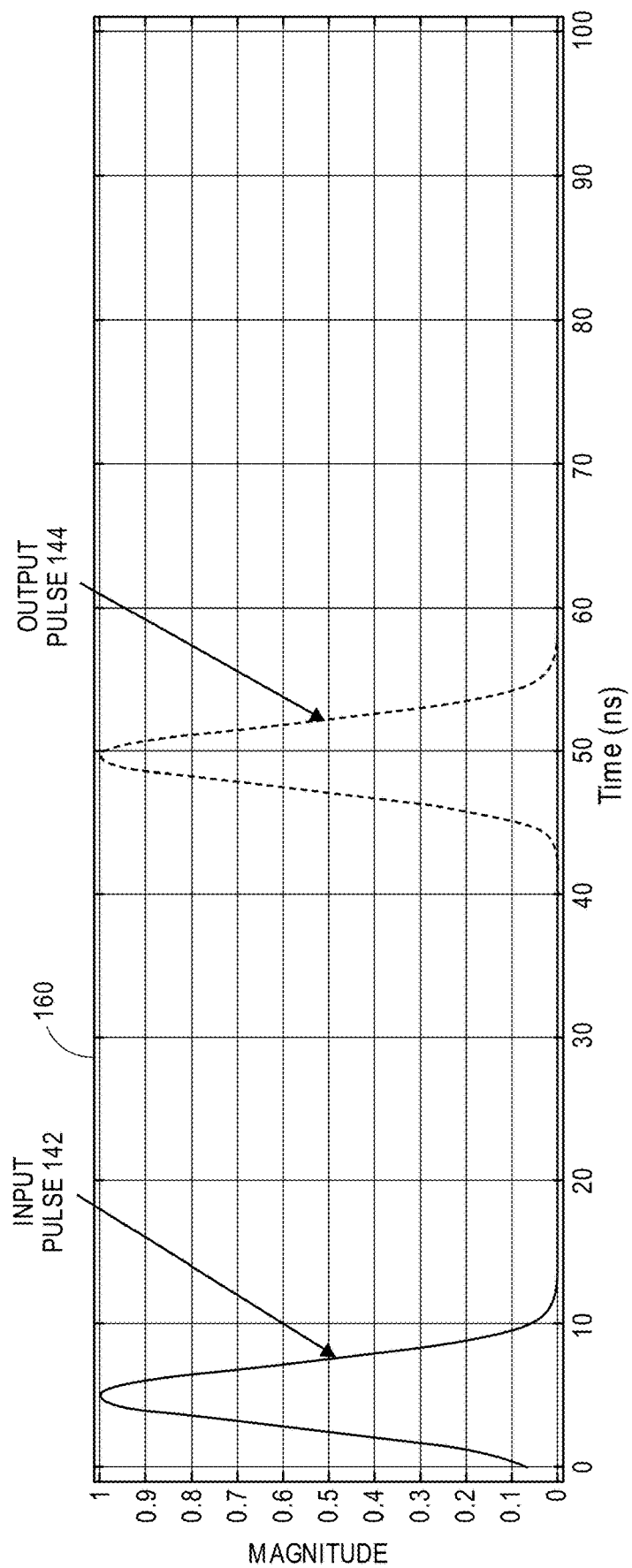
FIG. 1c illustrates a graph of transmission of the acoustic transmission signal in accordance with one embodiment.

FIG. 1b illustrates a pulse 140 (e.g., acoustic transmission signal) propagating through the acoustic line 130 in accordance with one embodiment. FIG. 1c illustrates a graph of transmission of the acoustic transmission signal in accordance with one embodiment. The graph 160 shows magnitude on a vertical axis versus time in nanoseconds on a horizontal axis. The transducer 110 generates an input pulse 142 which propagates across the acoustic line 130 until reaching the transducer 120 which receives an output pulse 144. The transducer 120 converts the output pulse 144 into an electrical signal.

In one example, compared to a delay line implementation using standard electrical transmission lines, the present design provides several orders of magnitude area reduction (e.g., up to 4 orders of magnitude) for the same time delay due to the difference in propagation speed of electromagnetic and acoustic waves due to a ratio of the speed of electromagnetic waves in air (about 3e8 m/s) compared to longitudinal acoustic waves in copper (4000 m/s) or air (340 m/s) being 75000 to 882000 respectively.

Compared to inductor-capacitor (LC) delay lines, the present design also provides significant area reduction. For example, to achieve a 50 nanosecond delay, an acoustic waveguide section of 200 um in length is enough if Cu is chosen as the waveguide material. In another example, using LC delay lines, the required inductors and capacitors can be calculated using:

$$T_d = \sqrt{LC}$$

which requires total inductance and capacitance in the order of 50 nH and 50 nF respectively (neglecting the impedance matching requirement which will result in even larger inductor values). The smallest commercial components that can achieve these values have sizes of approximately 0.6×0.3 mm to 1×0.5 mm. This results in a total area of at least 1 $mm^2$ when routing and assembly are included. Several components are also required to achieve low dispersion.

Figure 2:
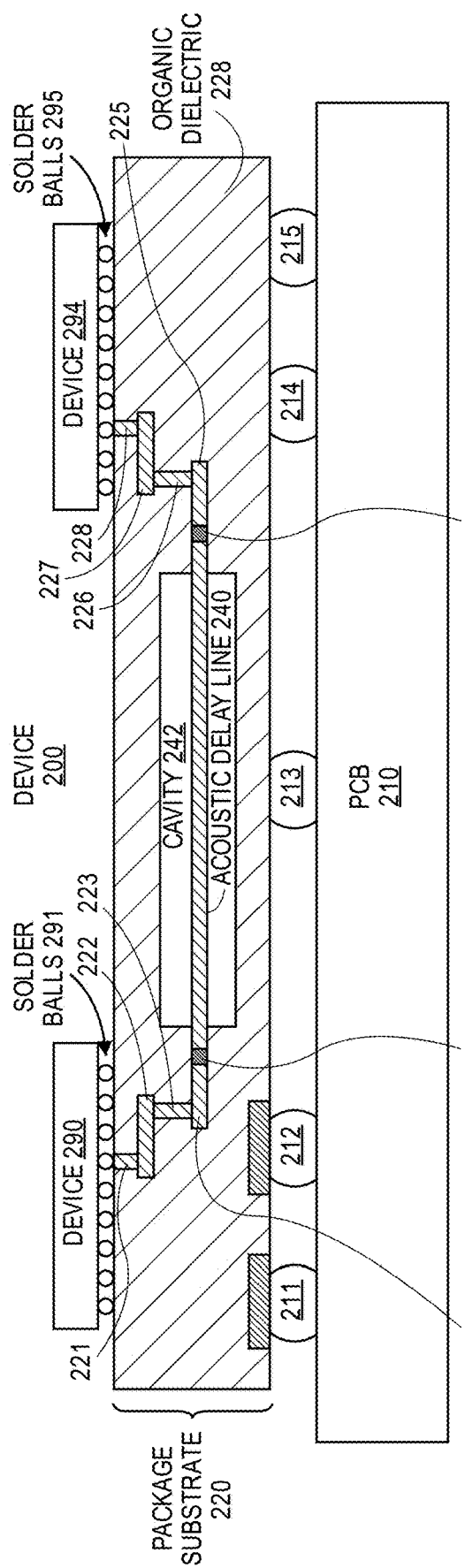
FIG. 2 illustrates a view of a microelectronic device 200 having package-integrated piezoelectric devices according to an embodiment.

Referring now to FIG. 2, a view of a microelectronic device 200 having package-integrated piezoelectric devices is shown, according to an embodiment. In one example, the microelectronic device 200 includes multiple devices 290 and 294 (e.g., die, chip, CPU, silicon die or chip, etc.) that are coupled or attached to a package substrate 220—with for example solder balls 291 and 295. The package substrate 220 is coupled or attached to the printed circuit board (PCB) 210 using for example solder balls 211-215.

The package substrate 220 (e.g., organic substrate) includes organic dielectric layers 228 and conductive layers 221-228 (e.g., copper layers, vias, thru connections, etc.). The conductive layers 221-224 and solder balls 291 electrically couple the device 290 to a transducer 250 (e.g., input transducer, output transducer). In a similar manner, the conductive layers 225-228 and solder balls 295 electrically couple the device 294 to a transducer 251 (e.g., output transducer, input transducer). In this manner, the acoustic delay line 240 provides a delay between the devices 290 and 294. Organic materials may include any type of organic material including flame retardant 4 (FR4), resin-filled polymers, prepreg (e.g., pre impregnated, fiber weave impregnated with a resin bonding agent), polymers, silica-filled polymers, etc. The package substrate 220 can be formed during package substrate processing (e.g., panel level). The panels formed can be large (e.g., having in-plane dimensions approximately 0.5 meter by 0.5 meter or greater, etc.) for lower cost. A cavity 242 is formed within the package substrate 220 by removing one or more layers (e.g., organic layers, organic dielectric layers, conductive layers, etc.) from the package substrate 220. In one example, piezoelectric transducers 250 and 251 are formed with a first conductive layer, a piezoelectric material disposed on the first conductive layer, and a second conductive layer disposed on the piezoelectric material. The conductive layers and piezoelectric material form a stack. The first conductive layer can act as a first electrode and the second conductive layer can act as a second electrode of the piezoelectric device or another electrode can be patterned to act as the second electrode of the device. The cavity 242 can be air-filled or vacuum-filled. The transducers are coupled to the acoustic delay line 240 (e.g., solid conductive layer, mesh conductive layer, etc.).

Figure 3:
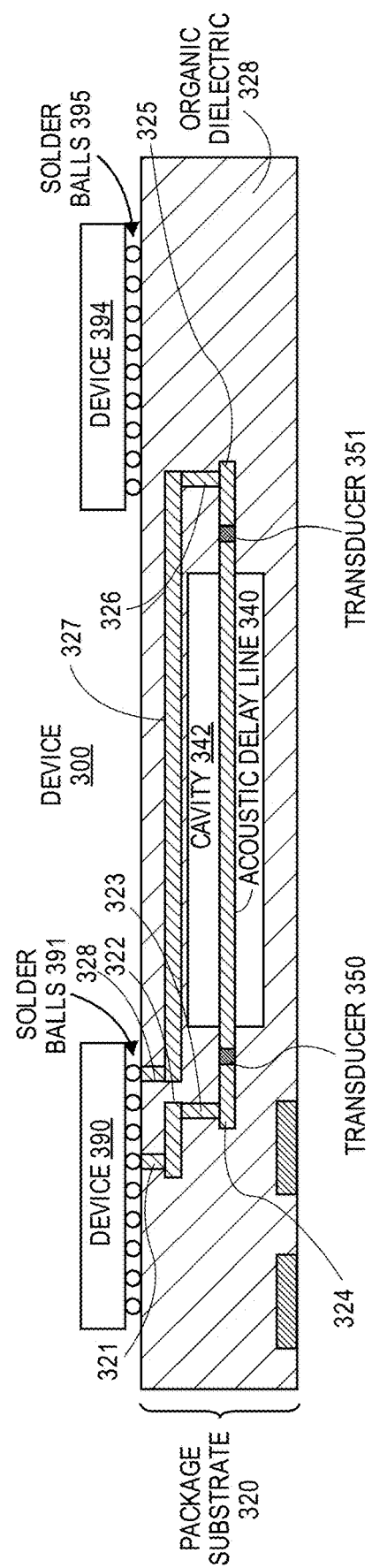
FIG. 3 illustrates a basic structure of a delay line implemented inside a PCB substrate in accordance with one embodiment.

The basic structure of a delay line implemented inside an organic substrate is shown in FIG. 3 in accordance with one embodiment. In one example, a microelectronic device 300 includes a device 390 (e.g., die, chip, CPU, silicon die or chip, etc.) that is coupled or attached to a substrate 320 (or printed circuit board 210)—with solder balls 391 and 395. Additional devices may also be coupled to the substrate.

The substrate 320 (e.g., organic substrate) includes organic dielectric layers 328 and conductive layers 321-328 (e.g., copper layers, vias, thru connections, etc.). The conductive layers 321-324 and solder balls 391 electrically couple the device 390 to a transducer 350 (e.g., input transducer, output transducer). In a similar manner, the conductive layers 325-328 and solder balls 391 electrically couple the device 390 to a transducer 351 (e.g., output transducer, input transducer). In this manner, the acoustic delay line 340 provides a delay for the device 390. Organic materials may include any type of organic material including flame retardant 4 (FR4), resin-filled polymers, prepreg (e.g., pre impregnated, fiber weave impregnated with a resin bonding agent), polymers, silica-filled polymers, etc. The substrate 320 can be formed during package substrate processing (e.g., panel level). The panels formed can be large (e.g., having in-plane dimensions approximately 0.5 meter by 0.5 meter or greater, etc.) for lower cost. A cavity 342 is formed within the package substrate 320 by removing one or more layers (e.g., organic layers, organic dielectric layers, conductive layers, etc.) from the package substrate 320. In one example, piezoelectric transducers 350 and 351 are formed with a first conductive layer, a piezoelectric material disposed on the first conductive layer, and a second conductive layer disposed on the piezoelectric material. The conductive layers and piezoelectric material form a stack. The first conductive layer can act as a first electrode and the second conductive layer can act as a second electrode of the piezoelectric device or another electrode can be patterned to act as the second electrode of the device. The cavity 342 can be air-filled or vacuum-filled. The transducers are coupled to the acoustic delay line 340 (e.g., solid conductive layer, mesh conductive layer, etc.).

The delay line 340 can be connected from both sides to a single die or between two dies. To achieve best performance the delay line should have a relatively flat transmission coefficient over a wide frequency band. This can be achieved using good electrical matching at the input and output transducers which maximizes the power transmission into and out of the acoustic delay line and reduces the acoustic reflections inside the delay line.

In one embodiment, a delay line (e.g., delay line 240, delay line 340) operates initially with an electric signal being applied to one of the transducers (e.g., transducer 250, transducer 251, transducer 350, transducer 351) on either side of the delay line. The transducer converts the applied electric signal into a pressure (or acoustic) wave generated by the displacement of the acoustic transducer. Then, the pressure (or acoustic) wave propagates through the delay line at a speed that depends on the material properties of the delay line (e.g., copper, insulating film, or composite) and on the mode of wave propagation across the delay line (e.g., transverse wave, longitudinal wave etc.). Subsequently, the pressure (or acoustic) wave reaches the other end of the delay line and the transducer on that end converts the displacement caused by the pressure (or acoustic) wave into an output electrical signal.

The acoustic delay line needs to be either well matched so that most of the mechanical energy is converted into electrical energy or be mechanically dampened (e.g., using rollers or inelastic material) to suppress the reflections. The output electrical signal is delayed by $T_d$ compared to the input electrical signal, where $T_d$ is given by:

$$T_d = \frac{L}{v}$$

L is the delay line length and v is the propagation speed of the pressure (or acoustic) wave inside the delay line. In one example, the transducers can be implemented by depositing and patterning piezoelectric materials (e.g., lead zirconate titanate (PZT), potassium sodium niobate (KNN), aluminum nitride (AlN), zinc oxide (ZnO), or other materials) in the organic substrate (or PCB) sandwiched between conductive electrodes as shown in FIGS. 4B and 5B. Copper or other conductive material can be used for the electrodes. The delay line itself can use air or a conductive trace as the medium for wave transmission as shown in FIGS. 4B and 5B respectively.

FIG. 4A illustrates a top view of a waveguide structure having a delay line implemented with an air medium for wave transmission in accordance with one embodiment. The waveguide structure 400 of an organic substrate includes organic material with one or more dielectric layers 402, a cavity 442, transducers 450 and 460 and acoustic delay line 443 (shown in FIG. 4B).

FIG. 4B illustrates a cross-sectional view AA' of a waveguide structure having a delay line implemented with an air medium for wave transmission in accordance with one embodiment. The waveguide structure 400 of an organic substrate includes organic dielectric layers 402, a cavity 442, conductive layers 421-431, and transducers 450 and 460. The transducer 450 includes a conductive layer 423 acting as a second electrode, piezoelectric material 452, and conductive layer 424 acting as a first electrode. The transducer 460 includes a conductive layer 429 acting as a second electrode, piezoelectric material 462, and conductive layer 428 acting as a first electrode.

Organic dielectric layers normally surround conductive layers (e.g., copper traces) in organic substrates (e.g., package substrates, PCBs). However, this organic material is removed around the transducers and delay line including an air medium in FIGS. 4A, 4B, 5A, and 5B to allow electrical to acoustic transduction. When the piezoelectric layer in the input transducer receives an input electrical signal across its electrodes, a mechanical deformation is induced, generating a pressure wave (e.g., waves 470) that travels across the acoustic delay line 443. When this wave reaches the piezoelectric material on the output side, that material deforms, generating an output electrical signal across its electrodes which has a time delay with respect to the input signal.

FIGS. 4A and 4B illustrate one example of using air as a transmission medium within a cavity 442 created inside a waveguide structure of a package substrate. In this case, the propagation speed is equal to the speed of sound in air (~340 m/sec) and the cavity can be made even smaller than if copper or some other solid medium was being used for wave transmission. However, due to the transition of the acoustic wave between different materials in this configuration (from copper to air then back to copper) additional losses and reflections occur and should be accounted for in the circuit design.

An alternative approach to improve the transmission and reduce the acoustic reflections is using a conductive layer (e.g., copper trace) as the medium for wave transmission and implementing a dielectric absorber at one end to reduce the reflections. This is schematically shown in FIGS. 5A and 5B below.

Figure 5A:
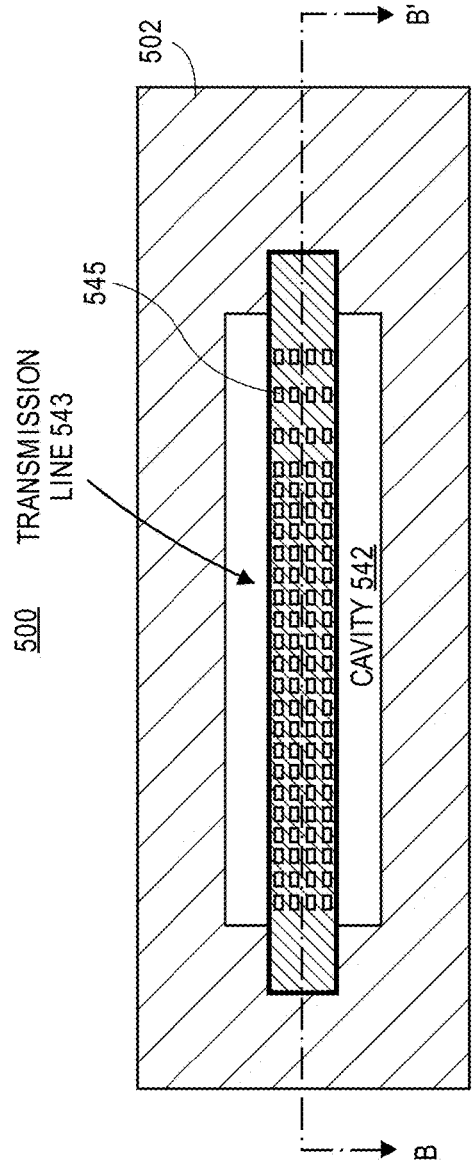
FIG. 5A illustrates a top view of a waveguide structure having a delay line implemented with a suspended layer (e.g., conductive beam, mesh) in accordance with one embodiment.
Figure 5B:
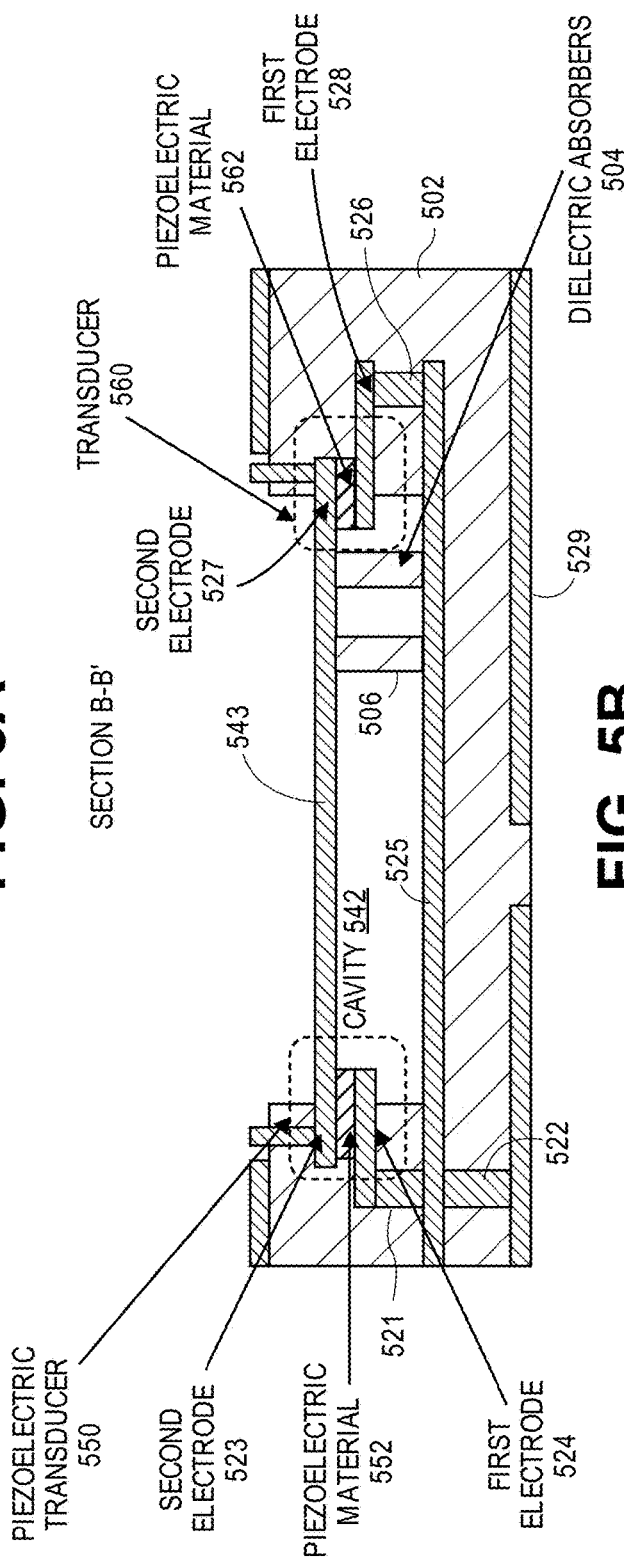
FIG. 5B illustrates a cross-sectional view BB' of a waveguide structure having a delay line implemented with a suspended layer (e.g., conductive beam, mesh) in accordance with one embodiment.

FIG. 5A illustrates a top view of a waveguide structure having a delay line implemented with a suspended layer (e.g., conductive beam, mesh) in accordance with one embodiment. The waveguide structure 500 of an organic substrate includes organic material with one or more dielectric layers 502, a cavity 542, transducers 550 and 560 (shown in FIG. 5B), and a transmission line 543 which includes a plurality of perforations 545.

FIG. 5B illustrates a cross-sectional view BB' of a waveguide structure having a delay line implemented with a suspended layer (e.g., conductive beam, mesh) in accordance with one embodiment. The waveguide structure 500 of an organic substrate includes organic dielectric layers 502, a cavity 542, conductive layers 521-529 and transducers 550 and 560. The transducer 550 includes a conductive layer 523 acting as a second electrode, piezoelectric material 552, and conductive layer 524 acting as a first electrode. The transducer 560 includes a conductive layer 527 acting as a second electrode, piezoelectric material 562, and conductive layer 528 acting as a first electrode.

The etching process is controlled such that it creates standing dielectric absorbers 504 (e.g., dielectric posts) that are still attached to the conductive transmission delay line 543 (e.g., copper line) in certain locations. One method of creating the standing structures is perforating the transmission line 543 as shown in FIG. 5A in accordance with one embodiment. When the perforations 545 are relatively close to each other, the dielectric under the conductive trace is completely etched away. When the perforations are farther apart, part of the dielectric remains attached to the conductive trace. The size and shape of the remaining dielectric can be adjusted by controlling the etch parameters and by designing the perforations accordingly.

The number and spacing of the dielectric absorbers can be used to effectively attenuate the signal and reduce the reflections in the delay line. Different perforation designs can be used to produce different shapes and arrangements for the dielectric posts in order to reduce the reflections over a wider frequency band. A few examples are shown in FIG. 6A-6D.

FIG. 6A illustrates a transmission line have a first arrangement of perforations in accordance with one embodiment. The transmission line 600 includes perforations 601-609.

FIG. 6B illustrates a transmission line have a second arrangement of perforations in accordance with one embodiment. The transmission line 610 includes perforations 611-616.

FIG. 6C illustrates a transmission line have a third arrangement of perforations in accordance with one embodiment. The transmission line 620 includes perforations 621-629.

FIG. 6D illustrates a transmission line have a fourth arrangement of perforations in accordance with one embodiment. The transmission line 630 includes perforations 631-634. Other arrangements, shapes, and sizes of perforations are possible in order to produce different dielectric post configurations for reducing the reflections of transmitted pressure (or acoustic) waves of the waveguide structure.

It will be appreciated that, in a system on a chip embodiment, the die may include a processor, memory, communications circuitry and the like. Though a single die is illustrated, there may be none, one or several dies included in the same region of the microelectronic device.

In one embodiment, the microelectronic device may be a crystalline substrate formed using a bulk silicon or a silicon-on-insulator substructure. In other implementations, the microelectronic device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of the present invention.

The microelectronic device may be one of a plurality of microelectronic devices formed on a larger substrate, such as, for example, a wafer. In an embodiment, the microelectronic device may be a wafer level chip scale package (WLCSP). In certain embodiments, the microelectronic device may be singulated from the wafer subsequent to packaging operations, such as, for example, the formation of one or more delay lines.

One or more contacts may be formed on a surface of the microelectronic device. The contacts may include one or more conductive layers. By way of example, the contacts may include barrier layers, organic surface protection (OSP) layers, metallic layers, or any combination thereof. The contacts may provide electrical connections to active device circuitry (not shown) within the die. Embodiments of the invention include one or more solder bumps or solder joints that are each electrically coupled to a contact. The solder bumps or solder joints may be electrically coupled to the contacts by one or more redistribution layers and conductive vias.

Figure 7:
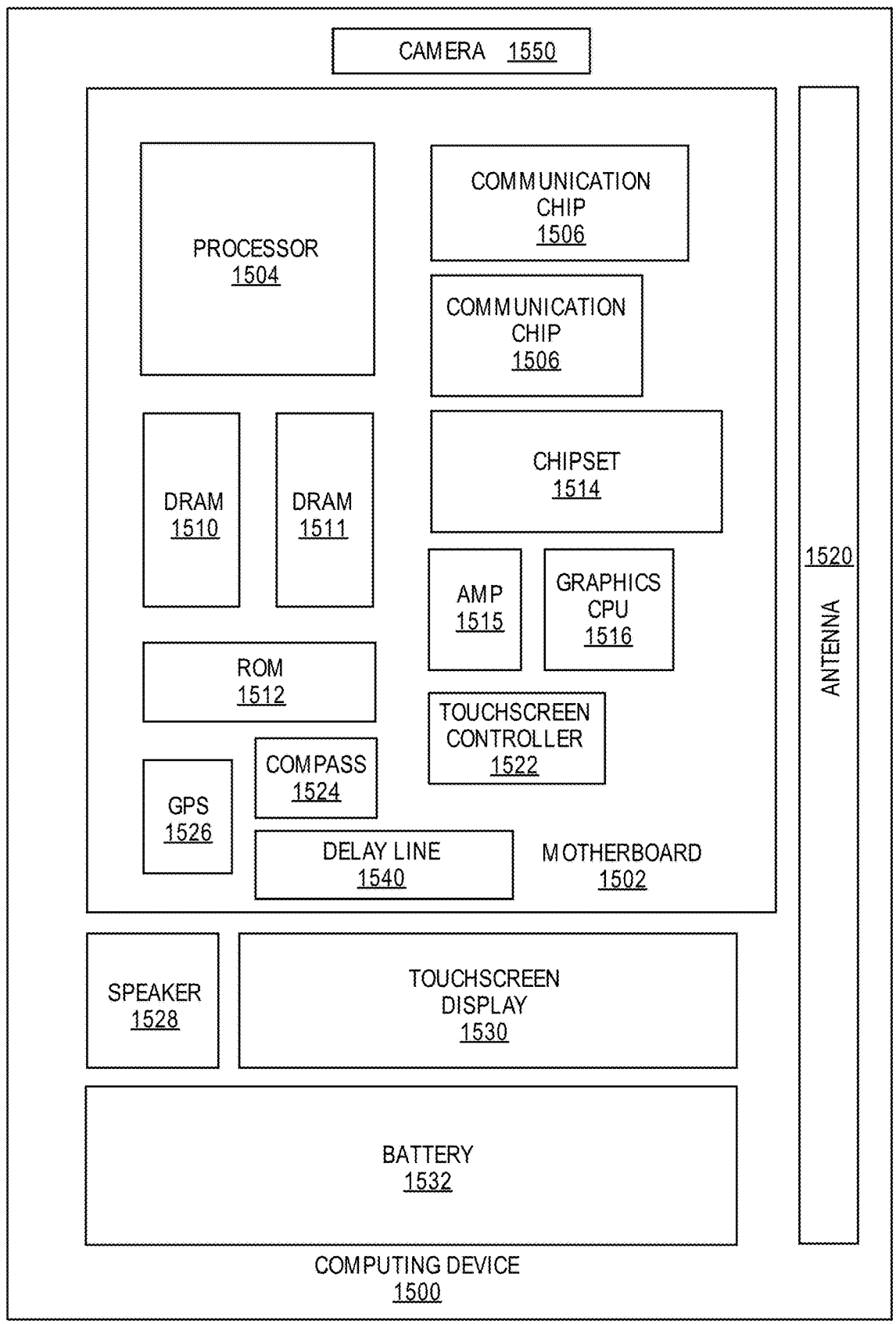
FIG. 7 illustrates a computing device 1500 in accordance with one embodiment.

FIG. 7 illustrates a computing device 1500 in accordance with one embodiment of the invention. The computing device 1500 houses a board 1502. The board 1502 may include a number of components, including but not limited to a processor 1504 and at least one communication chip 1506. The processor 1504 is physically and electrically coupled to the board 1502. In some implementations the at least one communication chip 1506 is also physically and electrically coupled to the board 1502. In further implementations, the communication chip 1506 is part of the processor 1504.

Depending on its applications, computing device 1500 may include other components that may or may not be physically and electrically coupled to the board 1502. These other components include, but are not limited to, volatile memory (e.g., DRAM 1510, 1511), non-volatile memory (e.g., ROM 1512), flash memory, a graphics processor 1516, a digital signal processor, a crypto processor, a chipset 1514, an antenna 1520, a display, a touchscreen display 1530, a touchscreen controller 1522, a battery 1532, an audio codec, a video codec, a power amplifier 1515, a global positioning system (GPS) device 1526, a compass 1524, a delay line structure 1540 (e.g., a piezoelectric delay line structure, waveguide structure), a gyroscope, a speaker, a camera 1550, and a mass storage device (such as hard disk drive, compact disk (CD), digital versatile disk (DVD), and so forth).

The communication chip 1506 enables wireless communications for the transfer of data to and from the computing device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1500 may include a plurality of communication chips 1506. For instance, a first communication chip 1506 may be dedicated to shorter range wireless communications such as Wi-Fi, WiGig and Bluetooth and a second communication chip 1506 may be dedicated to longer range wireless communications such as GPS, EDGE, GPRS, CDMA, WiMAX, LTE, Ev-DO, 5G, and others.

The processor 1504 of the computing device 1500 includes an integrated circuit die packaged within the processor 1504. In some implementations of the invention, the integrated circuit processor package or motherboard 1502 includes one or more devices, such as delay lines in accordance with implementations of embodiments of the invention. The term "processor" may refer to any device or portion of a device that processes electronic data from registers and/or memory to transform that electronic data into other electronic data that may be stored in registers and/or memory. The communication chip 1506 also includes an integrated circuit die packaged within the communication chip 1506. The following examples pertain to further embodiments. Example 1 is a waveguide structure comprising a first piezoelectric transducer positioned in proximity to a first end of a cavity of an organic substrate and a second piezoelectric transducer positioned in proximity to a second end of the cavity. The first piezoelectric transducer receives an input electrical signal and generates an acoustic wave to be transmitted with a transmission medium and the second piezoelectric transducer receives the acoustic wave from the transmission medium and generates an output electrical signal.

In example 2, the subject matter of example 1 can optionally include the first piezoelectric transducer comprising a second electrode disposed on a first piezoelectric material which is disposed on a first electrode of the first piezoelectric transducer.

In example 3, the subject matter of any of examples 1-2 can optionally further include the first piezoelectric transducer generating an acoustic wave in response to displacement of the first piezoelectric transducer that is caused by the input electrical signal.

In example 4, the subject matter of any of examples 1-3 can optionally further include the second piezoelectric transducer receiving the acoustic wave from the transmission medium and generating an output electrical signal based on the acoustic wave causing a displacement of the second piezoelectric transducer.

In example 5, the subject matter of any of examples 1-4 can optionally further include the output electrical signal being delayed by a time delay in comparison to the input electrical signal with the time delay being based on a length of the transmission medium and a propagation speed of the acoustic wave.

In example 6, the subject matter of any of examples 1-5 can optionally further include the transmission medium comprising air.

In example 7, the subject matter of any of examples 1-6 can optionally further include the transmission medium comprising a suspended conductive structure.

In example 8, the subject matter of any of examples 1-7 can optionally further include the transmission medium comprising a suspended conductive structure and dielectric absorbers coupled to the suspended conductive structure within the cavity.

In example 9, the subject matter of any of examples 1-8 can optionally further include the organic substrate comprising a package substrate that is fabricated at panel level.

Example 10 is a package substrate comprising a plurality of organic dielectric layers and a plurality of conductive layers to form the package substrate, a cavity formed in the package substrate, a first piezoelectric transducer positioned in proximity to a first end of the cavity, and a second piezoelectric transducer positioned in proximity to a second end of the cavity. The first piezoelectric transducer receives an input electrical signal and generates an acoustic wave to be transmitted with a transmission medium and a second piezoelectric transducer positioned in proximity to a second end of the cavity. The second piezoelectric transducer receives the acoustic wave from the transmission medium and generates an output electrical signal.

In example 11, the subject matter of example 10 can optionally include the first piezoelectric transducer comprising a second electrode disposed on a first piezoelectric material which is disposed on a first electrode of the first piezoelectric transducer.

In example 12, the subject matter of any of examples 10-11 can optionally include the first piezoelectric transducer generating an acoustic wave in response to displacement of the first piezoelectric transducer that is caused by the input electrical signal.

In example 13, the subject matter of any of examples 10-12 can optionally include the second piezoelectric transducer receiving the acoustic wave from the transmission medium and generating an output electrical signal based on the acoustic wave causing a displacement of the second piezoelectric transducer.

In example 14, the subject matter of any of examples 10-13 can optionally include the output electrical signal being delayed by a time delay in comparison to the input electrical signal with the time delay being based on a length of the transmission medium and a propagation speed of the acoustic wave.

In example 15, the subject matter of any of examples 10-14 can optionally include the transmission medium comprising air.

In example 16, the subject matter of any of examples 10-15 can optionally include the transmission medium comprising a suspended conductive structure.

In example 17, the subject matter of any of examples 10-16 can optionally include the transmission medium comprises a suspended conductive structure and dielectric absorbers coupled to the suspended conductive structure within the cavity to reduce reflections of the acoustic wave.

In example 18, the subject matter of any of examples 10-17 can optionally include the package substrate being fabricated at panel level.

Example 19 is a computing device comprising at least one processor to process data and a package substrate coupled to the at least one processor. The package substrate includes a plurality of organic dielectric layers and a plurality of conductive layers to form the package substrate which includes a first piezoelectric transducer positioned in proximity to a first end of a cavity of the package substrate. The first piezoelectric transducer receives an input electrical signal and generates an acoustic wave to be transmitted with a transmission medium. The package substrate includes a second piezoelectric transducer positioned in proximity to a second end of the cavity. The second piezoelectric transducer receives the acoustic wave from the transmission medium and generates an output electrical signal.

In example 20, the subject matter of example 19 can optionally include a printed circuit board coupled to the package substrate.

In example 21, the subject matter of any of examples 19-20 can optionally include the first piezoelectric transducer generating an acoustic wave in response to displacement of the first piezoelectric transducer that is caused by the input electrical signal.

In example 22, the subject matter of any of examples 19-21 can optionally include the second piezoelectric transducer receiving the acoustic wave from the transmission medium and generating an output electrical signal based on the acoustic wave causing a displacement of the second piezoelectric transducer.

The invention claimed is:

1. A waveguide structure, comprising:
a cavity disposed within an organic substrate, wherein the cavity is entirely enclosed within the organic substrate;
a first piezoelectric transducer positioned in proximity to a first end of the cavity of the organic substrate, the first piezoelectric transducer to receive an input electrical signal and to generate an acoustic wave to be transmitted with a transmission medium; and
a second piezoelectric transducer positioned in proximity to a second end of the cavity of the organic substrate, the second piezoelectric transducer to receive the acoustic wave from the transmission medium and to generate an output electrical signal, wherein the transmission medium is positioned within the cavity of the organic substrate.

2. The waveguide structure of claim 1, wherein the first piezoelectric transducer comprises a second electrode disposed on a first piezoelectric material which is disposed on a first electrode of the first piezoelectric transducer.

3. The waveguide structure of claim 2, wherein the first piezoelectric transducer generates the acoustic wave in response to a displacement of the first piezoelectric transducer that is caused by the input electrical signal.

4. The waveguide structure of claim 1, wherein the second piezoelectric transducer receives the acoustic wave from the transmission medium and generates the output electrical signal based on the acoustic wave causing a displacement of the second piezoelectric transducer.

5. The waveguide structure of claim 1, wherein the output electrical signal is delayed by a time delay in comparison to the input electrical signal with the time delay being based on a length of the transmission medium and a propagation speed of the acoustic wave.

6. The waveguide structure of claim 1, wherein the transmission medium comprises air.

7. The waveguide structure of claim 1, wherein the transmission medium comprises a suspended conductive structure.

8. The waveguide structure of claim 1, wherein the transmission medium comprises a suspended conductive structure and dielectric absorbers coupled to the suspended conductive structure within the cavity.

9. The waveguide structure of claim 1, wherein the organic substrate comprises a package substrate that is fabricated at panel level.

10. A package substrate comprising:
a plurality of organic dielectric layers and a plurality of conductive layers to form the package substrate;
a cavity disposed within the package substrate, wherein the cavity is entirely enclosed within the plurality of organic dielectric layers of the package substrate;
a first piezoelectric transducer positioned in proximity to a first end of the cavity, the first piezoelectric transducer to receive an input electrical signal and to generate an acoustic wave to be transmitted with a transmission medium; and
a second piezoelectric transducer positioned in proximity to a second end of the cavity, the second piezoelectric transducer to receive the acoustic wave from the transmission medium and to generate an output electrical signal, wherein the transmission medium is positioned within the cavity of the organic substrate.

11. The package substrate of claim 10, wherein the first piezoelectric transducer comprises a second electrode disposed on a first piezoelectric material which is disposed on a first electrode of the first piezoelectric transducer.

12. The package substrate of claim 10, wherein the first piezoelectric transducer generates the acoustic wave in response to a displacement of the first piezoelectric transducer that is caused by the input electrical signal.

13. The package substrate of claim 10, wherein the second piezoelectric transducer receives the acoustic wave from the transmission medium and generates the output electrical signal based on the acoustic wave causing a displacement of the second piezoelectric transducer.

14. The package substrate of claim 10, wherein the output electrical signal is delayed by a time delay in comparison to the input electrical signal with the time delay being based on a length of the transmission medium and a propagation speed of the acoustic wave.

15. The package substrate of claim 10, wherein the transmission medium comprises air.

16. The package substrate of claim 10, wherein the transmission medium comprises a suspended conductive structure.

17. The package substrate of claim 10, wherein the transmission medium comprises a suspended conductive structure and dielectric absorbers coupled to the suspended conductive structure within the cavity to reduce reflections of the acoustic wave.

18. The package substrate of claim 10, wherein the package substrate is fabricated at panel level.

19. A computing device comprising:
at least one processor to process data;
a package substrate coupled to the at least one processor, the package substrate including a plurality of organic dielectric layers and a plurality of conductive layers to form the package substrate which includes
a cavity disposed within the package substrate, wherein the cavity is entirely enclosed within the plurality of organic dielectric layers of the package substrate;
a first piezoelectric transducer positioned in proximity to a first end of a cavity of the package substrate, the first piezoelectric transducer to receive an input electrical signal and to generate an acoustic wave to be transmitted with a transmission medium; and
a second piezoelectric transducer positioned in proximity to a second end of the cavity, the second piezoelectric transducer to receive the acoustic wave from the transmission medium and to generate an output electrical signal.

20. The computing device of claim 19, further comprising: a printed circuit board coupled to the package substrate.

21. The computing device of claim 19, wherein the first piezoelectric transducer generates the acoustic wave in response to a displacement of the first piezoelectric transducer that is caused by the input electrical signal.

22. The computing device of claim 19, wherein the second piezoelectric transducer receives the acoustic wave from the transmission medium and generates the output electrical signal based on the acoustic wave causing a displacement of the second piezoelectric transducer.

* * * * *